(12) United States Patent
Sadaka et al.

(10) Patent No.: US 8,440,539 B2
(45) Date of Patent: May 14, 2013

(54) ISOLATION TRENCH PROCESSING FOR STRAIN CONTROL

(75) Inventors: Mariam G. Sadaka, Austin, TX (US); Michael A. Mendicino, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 508 days.

(21) Appl. No.: 11/831,400

(22) Filed: Jul. 31, 2007

(65) Prior Publication Data

US 2009/0035914 A1 Feb. 5, 2009

(51) Int. Cl.
*H01L 21/762* (2006.01)

(52) U.S. Cl.
USPC ............................ 438/413; 438/400; 438/426

(58) Field of Classification Search .................. 438/413, 438/424, 429, 431, 439, 442, 225, 297, 362, 438/410, 426, 430, 448, 400; 257/347
See application file for complete search history.

(56) References Cited

U.S. PATENT DOCUMENTS

| | | | | |
|---|---|---|---|---|
| 6,093,622 | A * | 7/2000 | Ahn et al. | 438/439 |
| 7,232,728 | B1 * | 6/2007 | Lee et al. | 438/300 |
| 2004/0087103 | A1 * | 5/2004 | Kanamori | 438/423 |
| 2005/0095807 | A1 | 5/2005 | Xiang | |
| 2005/0116217 | A1 | 6/2005 | Jones et al. | |
| 2005/0156274 | A1 | 7/2005 | Yeo et al. | |
| 2007/0155121 | A1 * | 7/2007 | Frohberg et al. | 438/424 |
| 2007/0202652 | A1 * | 8/2007 | Moroz et al. | 438/296 |

* cited by examiner

*Primary Examiner* — Daniel Whalen
*Assistant Examiner* — Suberr Chi
(74) *Attorney, Agent, or Firm* — Jackson Walker L.L.P.

(57) ABSTRACT

A semiconductor fabrication process includes forming a hard mask, e.g., silicon nitride, over an active layer of a silicon on insulator (SOI) wafer, removing a portion of the hard mask and the active layer to form a trench, and forming an isolation dielectric in the trench where the dielectric exerts compressive strain on a channel region of the active layer. Forming the dielectric may include performing a thermal oxidation. Before performing the thermal oxidation, semiconductor structures may be formed, e.g., by epitaxy, on sidewalls of the trench. The structures may be silicon or a silicon compound, e.g., silicon germanium. During the thermal oxidation, the semiconductor structures are consumed. In the case of a silicon germanium, the germanium may diffuse during the thermal oxidation to produce a silicon germanium channel region.

18 Claims, 4 Drawing Sheets

US 8,440,539 B2

ISOLATION TRENCH PROCESSING FOR STRAIN CONTROL

FIELD OF THE INVENTION

The invention is in the field of semiconductor fabrication processes and, more particularly, semiconductor fabrication processes that employ engineering of channel strain characteristics.

RELATED ART

In the field of semiconductor fabrication, inducing strain in the transistor channel region is known. For example, inducing compressive strain along the channel is known to desirably improve the performance of PMOS devices. Methods for adding uniaxial strain by using embedded SiGe, by depositing a compressive interlevel dielectric (ILD) layer over PMOS devices, or adding a nitride layer in a trench isolation structure to induce compressive strain have been reported. Each of these techniques introduces one or more problems. Embedded SiGe, for example, complicates front end processing. As another example, the use of a compressive ILD implies one or more steps to form the compressive ILD selectively to avoid degrading NMOS devices. It would be desirable to implement a fabrication process to achieve desirable strain in selected devices while minimizing the impact to existing fabrication processes.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. The dimensions of some of the elements in the figures may be exaggerated relative to other elements to help improve the understanding of the embodiments of the present invention. As an example, horizontally oriented dimensions may be approximately scaled differently than the vertically oriented dimensions.

DETAILED DESCRIPTION OF THE DRAWINGS

In one aspect, a semiconductor fabrication process includes forming a hard mask, e.g., silicon nitride, over an active layer of a silicon on insulator (SOI) wafer, removing a portion of the hard mask and the active layer to form a trench, and forming an isolation dielectric in the trench where the dielectric exerts compressive strain on a channel region of the active layer. Forming the dielectric may include performing a thermal oxidation. The thermally formed trench fill oxide is better suited to compress the adjacent channel than deposited isolation dielectrics because volume expansion of the thermally-formed trench fill oxide exerts mechanical strain along the channel direction through the trench sidewalls.

Before performing the thermal oxidation, semiconductor structures may be formed, e.g., by epitaxy, on sidewalls of the trench. The structures may be silicon or a silicon compound, e.g., silicon germanium. During the thermal oxidation, the semiconductor structures are consumed. In the case of a silicon germanium, the germanium may diffuse during the thermal oxidation to produce a silicon germanium channel region.

In another aspect, an integrated circuit includes an isolation dielectric laterally adjacent to an active layer of an SOI substrate where the isolation dielectric includes a thermally formed silicon dioxide and the isolation dielectric exerts compressive strain on the laterally adjacent active layer. The active layer may be a silicon layer or a silicon compound such as silicon germanium.

Figure 1:
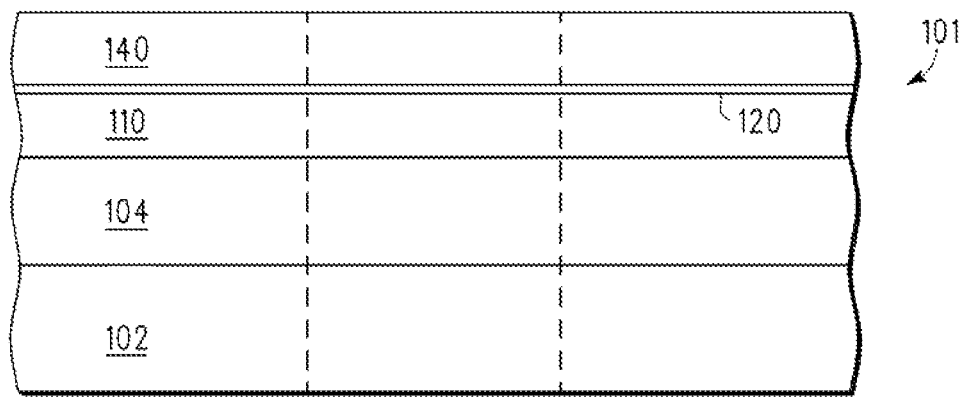
FIG. 1 is a partial cross sectional view of a semiconductor wafer at an intermediate step of a semiconductor fabrication process in which a hard mask layer is formed overlying a semiconductor-on-insulator wafer.

Turning now to the drawings, FIG. 1 is a partial cross sectional view of a semiconductor wafer 101 at an intermediate stage in a semiconductor fabrication process for fabricating semiconductor devices or integrated circuits. As depicted in FIG. 1, semiconductor wafer 101 includes bulk layer 102 over which a buried oxide (BOX) layer 104 is positioned over which an active layer 110 is positioned. In embodiments commonly referred to as silicon-on-insulator (SOI) embodiments, bulk layer 102 is a lightly doped, single crystal silicon layer that provides mechanical support for the integrated circuit, BOX layer 104 is a thermally formed or deposited silicon-oxide layer, and active layer 110 is a single crystal semiconductor layer of a material such as silicon. However, an SOI wafer may have other configurations or be formed by other methods in other embodiments.

As depicted in FIG. 1, a hard mask layer 140 is located overlying active layer 110. In some embodiments, hard mask layer 140 is a silicon nitride layer formed using well known chemical vapor deposition techniques. In embodiments that employ silicon nitride for hard mask layer 140, a pad layer 120 is formed between hard mask layer 140 and active layer 110 to prevent the compressive silicon nitride from damaging the crystalline structure of active layer 110. Although the depicted implementation is an SOI implementation in which active layer 110, other embodiments may apply similar analogous trench engineering techniques to convention wafers, i.e., non-SOI wafers. In non-SOI embodiments, the active layer may comprise an upper portion of the wafer substrate.

Figure 2:
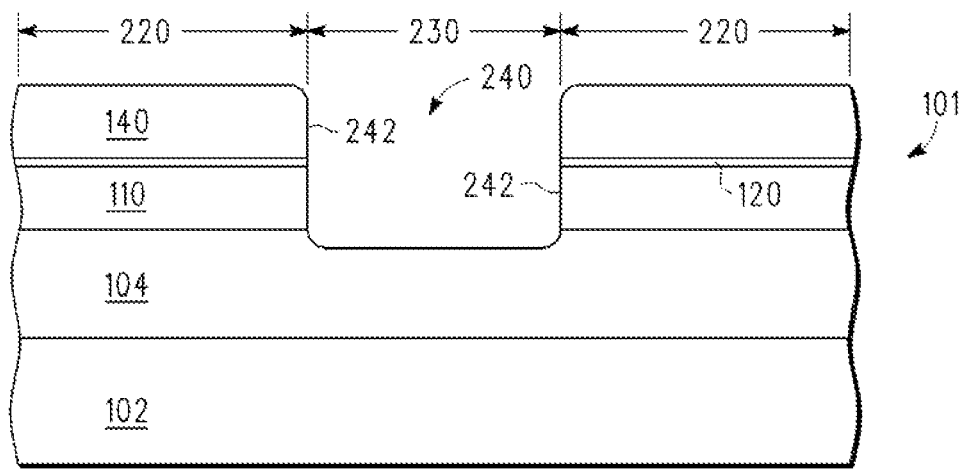
FIG. 2 depicts processing subsequent to FIG. 1 in which an isolation region of an active layer of the wafer is removed.

In FIG. 2 as shown, a trench 240 is formed in an isolation region 230 of active layer 110. Isolation region 230 is laterally displaced between a pair of channel regions 220. Isolation region 230 corresponds to a region of semiconductor wafer 101 in which active layer 110 has been removed and that will be dedicated to a transistor isolation structure or element. Channel regions 220 refer to regions of integrated circuit 101 that will contain active devices. Formation of trench 240 may be achieved using conventional plasma enhanced etch processing. Sidewalls 242 are preferably perpendicular or substantially perpendicular to an upper surface of active layer 110. As depicted in FIG. 2, trench 240 extends entirely through active layer 110 and into the underlying BOX layer 104.

Figure 3:
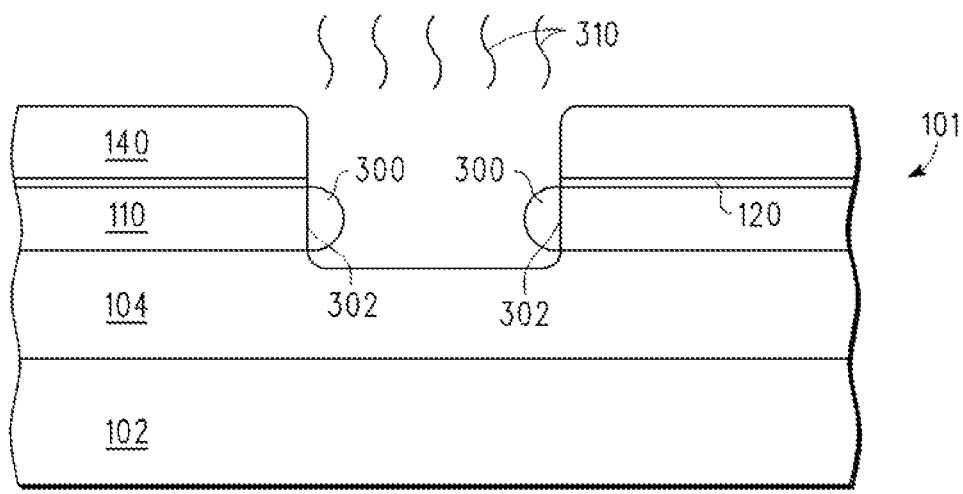
FIG. 3 depicts processing subsequent to FIG. 2 in which a dielectric structure is thermally formed selectively on the trench sidewalls.
Figure 4:
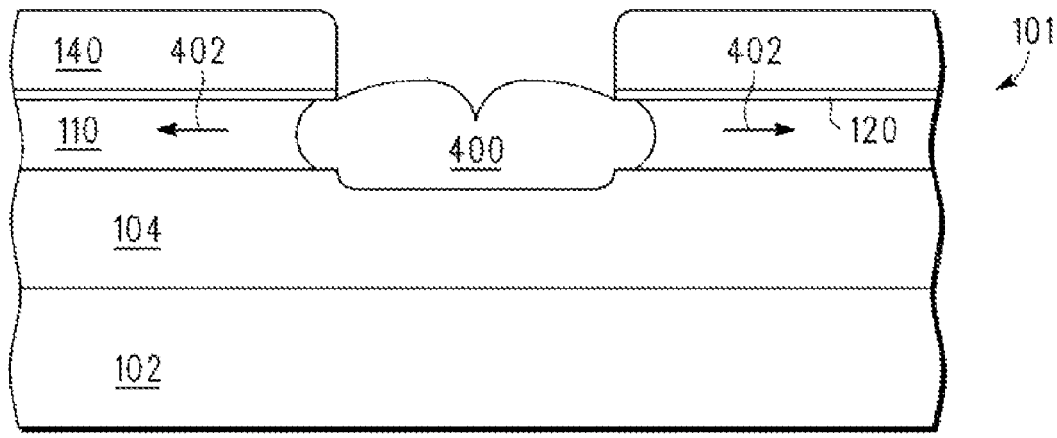
FIG. 4 depicts further processing subsequent to FIG. 3 in which the thermally formed dielectric fills the trench.

In FIG. 3 and FIG. 4 as shown, a first of three depicted embodiments for forming a strain altering isolation structure is presented. In the embodiment represented by FIG. 3 and FIG. 4, isolation structures 300 are formed at a sidewall interface 302 of active layer 110. Sidewall interfaces 302 are the portions of active layer 110 exposed when isolation trench 240 is formed. For embodiments in which active layer 110 is silicon, isolation structures 300 may be formed using conventional thermal oxidation represented by reference numeral 310, in which semiconductor wafer 101 is exposed to an oxygen bearing ambient at an elevated temperature, e.g., in excess of 600 C. for a specified duration. In such embodiments, isolation structures 300 are thermally formed silicon dioxide structures. FIG. 3 depicts a relatively early stage in the formation of the dielectric structures 300 in which the structures 300 are too small to fill trench 240 and do not consume a substantial amount of active layer 110. It is well known that thermal oxidation processes consume a portion of the semiconductor material on which the dielectric structure is formed.

FIG. 4 depicts a semiconductor wafer 101 at a later stage in the formation of isolation structures 300. At the stage depicted in FIG. 4, the thermal oxidation process has proceeded to the point where the once distinct isolation structures that formed on opposing sidewall interfaces 302 have grown and merged into a single isolation dielectric 400 that fills and perhaps over-fills trench 240. Isolation dielectric 400 as seen in FIG. 4 extends into the active regions 110 at its lateral extremities. These portions of isolation dielectric 400 represent regions of active layer 110 that are consumed in the thermal formation of isolation dielectric 400. Similarly, although not visible as depicted in FIG. 4, the thermal formation of isolation dielectric 400 may result in the oxidation of underlying portions of substrate 102.

The formation of isolation dielectric 400 as described herein produces compressive strain, represented by strain vectors 402, acting on the channel regions 220 of active layer 110. Strain vectors 402 result, at least in part, from voluminous expansion of isolation dielectric 400 as it fills and possibly overfills trench 240. The orientation of strain vectors 402 is parallel to the direction of the travel for current carriers in the subsequently formed active devices. In PMOS devices especially, the compressive strain represented by strain vectors 402 enhances carrier mobility and improves at least some device characteristics including the drain current for the device. Thus, in some embodiments, isolation dielectrics 400 are selectively formed in PMOS regions of wafer 101. In PMOS regions of wafer 101 at the processing stage represented by FIG. 4, active layer 110 is n-type silicon doped with an n-type impurity, e.g., phosphorous or arsenic.

Figure 5:
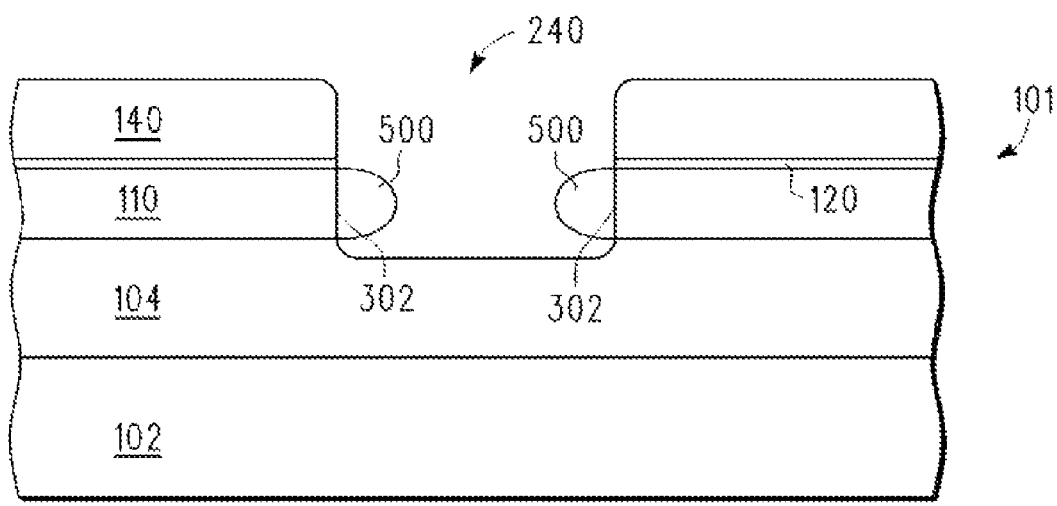
FIG. 5 depicts alternative processing subsequent to FIG. 2, in which a semiconductor structure is formed selectively on sidewalls of the trench.
Figure 6:
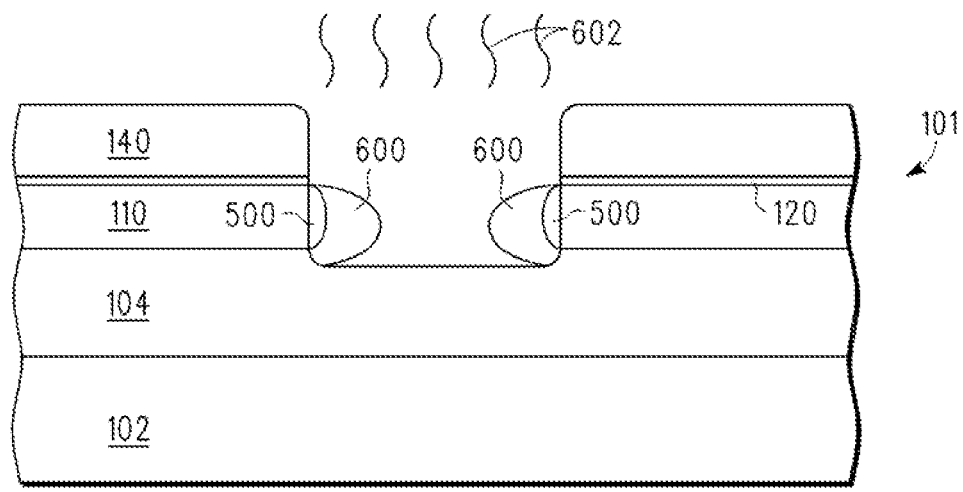
FIG. 6 depicts processing subsequent to FIG. 5 in which an dielectric is formed on the semiconductor structure.
Figure 7:
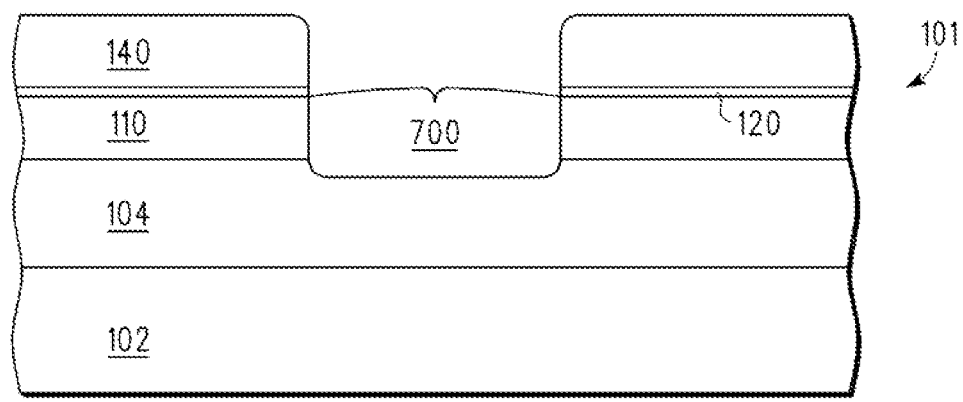
FIG. 7 depicts processing subsequent to FIG. 6 in which the substantially fills the trench.

Referring now to FIG. 5 through FIG. 7, a second embodiment of inducing strain in channel regions 220 of active layer 110 is depicted. In FIG. 5, which depicts processing subsequent to the processing depicted in FIG. 2, semiconductor structures 500 are selectively formed at the sidewall interfaces 302 of active layer 110. In some embodiments, active layer 110 is a single crystal silicon layer and semiconductor structures 500 are silicon structures. In these embodiments, semiconductor structures 500 may be formed using homoepitaxial processing by exposing sidewall interfaces 302 to a silicon bearing ambient, e.g., silane, maintained at an elevated temperature, e.g., in excess of approximately 600 C. The specific time, temperature, pressure, and other processing parameters used for epitaxial formation of semiconductor structures 500 are implementation details that depend on a variety of factors. Similarly, the size of semiconductor structures 500 is implementation specific and may depend, for example, upon the dimensions of trench 240. The processing parameters for epitaxial formation of semiconductor structures may be tailored, for example, to produce semiconductors structures 500 having a specified depth or occupying a specified percentage of trench 240.

In FIG. 6, an early stage in a thermal oxidation process, represented by reference numerals 602, is depicted. Thermal oxidation process 602 includes exposing wafer 101 to an oxygen bearing ambient maintained at an elevated temperature, e.g., in excess of 600 C. For implementations that employ silicon active layers 110 and silicon semiconductor structures 500, thermal oxidation process 602 produces dielectric structures 600 comprised of thermally formed silicon dioxide at the exposed surfaces of semiconductor structures 500. As discussed above, thermal formation of silicon dioxide consumes a portion of the underlying silicon and, as depicted in FIG. 6, the formation of silicon dioxide dielectric structures 500 consumes semiconductor structures 500.

FIG. 7 depicts wafer 101 after completion of thermal oxidation processing 602 (FIG. 6). FIG. 7 illustrates an implementation in which the isolation dielectric 700 formed by thermal oxidation processing 602 fills trench 240 just as semiconductor structures 500 are completely consumed by the thermal oxidation process. This implementation is achieved by optimizing the size of semiconductor structures 500 as they are formed in FIG. 5 in relation to the dimensions of trench 240 and the characteristics of thermal oxidation processing 602. Whereas the thermal oxidation processing depicted in FIG. 4 consumes peripheral portions of the active layer channel regions 220, the silicon consumed in the formation of isolation dielectric is limited to the epitaxially formed semiconductor structures 500. In this manner, the channel regions 220 of active layer 110 are substantially conserved. It will be appreciated that, although FIG. 7 illustrates an idealized implementation in which the silicon necessary for the formation of isolation dielectric 700 is equal to or substantially equal to the amount of silicon in semiconductor structures 500, the concept of forming semiconductor structures on the sidewalls of isolation trench 240 before performing a thermal oxidation process is applicable to other implementations in which larger or smaller semiconductor structures are used.

Figure 8:
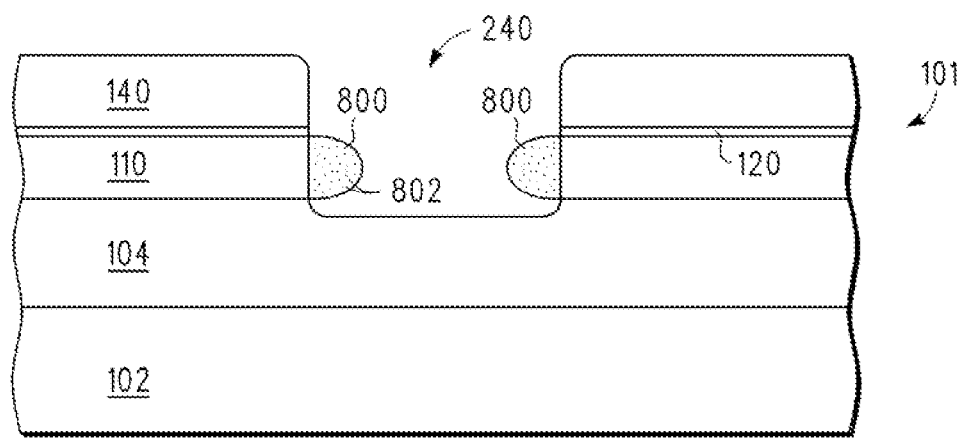
FIG. 8 depicts alternative processing subsequent to FIG. 2, in which a semiconductor structure of a different material than the material used in FIG. 5 is formed selectively on sidewalls of the trench.
Figure 9:
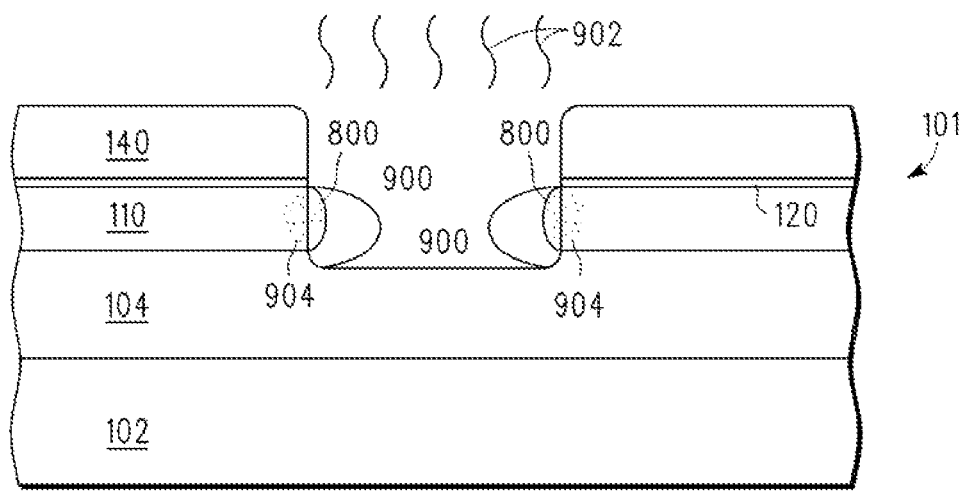
FIG. 9 depicts processing subsequent to FIG. 8 in which an dielectric is formed on the semiconductor structure wherein a species of the semiconductor structure has begun to diffuse into the channel.
Figure 10:
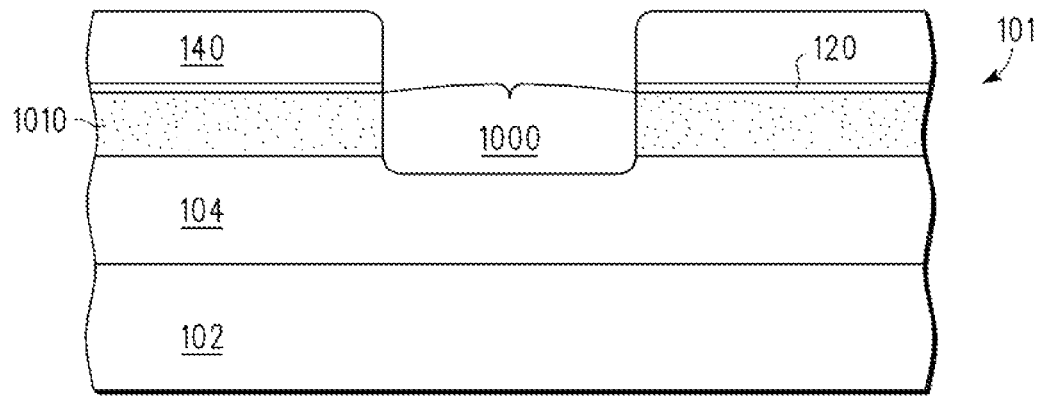
FIG. 10 depicts processing subsequent to FIG. 9 in which the dielectric substantially fills the trench and the species has substantially entirely diffused into the channel.

FIG. 8 through FIG. 10 depict a third embodiment of a processing sequence that may be employed following the formation of trench 240 in FIG. 2. In this embodiment, compound semiconductor structures 800 are formed on the sidewall interfaces 302 of active layer 110. In some embodiments, compound semiconductor structures 800 include silicon and a second element 802, e.g., germanium or carbon. In embodiments emphasizing improved performance for PMOS devices, for example, silicon germanium may be employed selectively and beneficially as the transistor channel material for PMOS devices. Formation of compound semiconductor structures 800 may be achieved using a heteroepitaxy process in which sidewall interfaces 302 are exposed to an ambient containing silicon and germanium species, silicon and carbon species, or another compound. In other embodiments, second element 802 may be introduced into semiconductors structures 800 after the epitaxial formation of the semiconductor structures using ion implantation, diffusion, or another suitable process.

In FIG. 9, an early stage of thermal oxidation processing 902 is illustrated. At the stage of thermal oxidation process 902 depicted in FIG. 9, portions of compound semiconductor structures 800 have been converted to dielectric structures 900 while at least some portion of the original semiconductor structures 800 remains. In addition to the formation of dielectric structures 900, thermal oxidation processing 902 produces a diffusion of the second element into channel regions 220 of active layer 110. This diffusion produces regions 904 of compound semiconductor material. FIG. 10 illustrates wafer 101 at or near the end of thermal oxidation processing 902. In the depicted cross section, semiconductor structures 800 have been completely consumed, a thermally formed isolation dielectric 1000 fills trench 240, and diffusion of second element 802 from the previously existing semiconductor structures has resulted in a compound material active layer 110. For embodiments that have a silicon active layer and silicon germanium semiconductor structures 800, for example, thermal oxidation processing 902 results in the formation of isolation dielectric 1000 and a silicon germanium active layer 1010. Like the first and second embodiment described above with respect to FIGS. 3-4 and FIGS. 5-7 respectively, this third embodiment is suitable for producing transistors having desirable characteristics. For example, the presence of a compression producing isolation dielectric in combination with a silicon compound (e.g., silicon germanium) transistor channel region results in PMOS devices having highly desirable carrier mobility characteristics that can improve device performance over the performance of like-sized transistors that do not have the compound channel or the compression producing isolation dielectric.

Following the processing depicted in either FIG. 4, FIG. 7, or FIG. 10, hard mask layer 140 and any sacrificial layer 120 are removed. Thereafter, using processing not depicted, an integrated circuit is fabricated using well known processing steps including steps for forming one or more gate dielectric layers; transistor gates structures; source/drain diffusion regions that may include extension regions, halo regions, lightly doped drain (LDD) regions, and the like; and a series of interconnect layers and interlevel dielectric layers that are used to connect the transistors in a desired configuration, all as are well known in the field of semiconductor fabrication. The resulting integrated circuit beneficially includes transistors possessing a compressively strained channel region some of which may be comprised of silicon germanium or another compound semiconductor material. Some embodiments may employ the described processing selectively to a desired subset of the transistors. For example, the described processing may be selectively applied to all PMOS devices or to a subset of PMOS devices.

In the foregoing specification, the invention has been described with reference to specific embodiments. However, one of ordinary skill in the art appreciates that various modifications and changes can be made without departing from the scope of the present invention as set forth in the claims below. For example, while wafer 101 in the illustrated embodiments is an SOI wafer, other embodiments may employ conventional silicon or epitaxial wafers in which the active layer directly overlies or is a part of the bulk region. As another example, although the described embodiments refer to exemplary chemical compositions for certain processing steps, such as the silane referred in the description of the formation of semiconductor structures 500, other embodiments may employ alternative chemistries to achieve the same or functionally analogous results. As suggested by these examples, the figures and detailed description are illustrative rather than restrictive, and that various modifications not described explicitly, but that would be apparent to one of ordinary skill in the field of semiconductor fabrication familiar with this disclosure, are within the scope of the claimed subject matter.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming a hard mask overlying an active layer of a wafer, the active layer overlying a buried oxide layer;
   removing a portion of the hard mask and the active layer to form a trench in the active layer, the trench extending through the active layer to the oxide layer wherein active layer portions of sidewalls of the trench expose portions of the active layer and buried oxide portions of the sidewalls expose portions of the buried oxide layer;
   forming semiconductor structures selectively on the active layer portions of the trench sidewalls without forming the semiconductor structures directly on the buried oxide portions of the sidewalls; and
   forming an isolation dielectric in the trench.

2. The method of claim 1, wherein forming the hard mask includes forming a silicon nitride layer overlying the active layer.

3. The method of claim 1, wherein the active layer includes a silicon layer and wherein forming the isolation dielectric includes exposing the wafer to an oxygen bearing ambient maintained at a temperature exceeding 600°C.

4. The method of claim 1, wherein the buried oxide layer overlies a bulk layer of the wafer.

5. The method of claim 1, wherein the semiconductor structures include silicon.

6. The method of claim 5, wherein forming the semiconductors comprises forming the semiconductor structures by epitaxy.

7. The method of claim 6, wherein the active layer includes silicon.

8. The method of claim 6, wherein forming the semiconductor structures by epitaxy comprises forming the semiconductor structures by heteroepitaxy.

9. The method of claim 8, wherein the active layer is silicon and the semiconductor structures comprise a compound semiconductor.

10. The method of claim 9, wherein the semiconductor structures comprise silicon germanium.

11. The method of claim 5, wherein forming the isolation dielectric is performed for a duration sufficient to consume the semiconductor structures completely.

12. A semiconductor fabrication process for forming isolation structures, comprising:
   forming a hard mask layer overlying an active layer of a wafer; and
   forming a trench in a PMOS region of the active layer, wherein forming the trench comprises removing at least a portion of the PMOS region and portions of the hard mask layer overlying the portion of the PMOS region;

forming a semiconductor structure on a sidewall portion of the trench without forming the semiconductor structure directly on a lower surface of the trench;

forming a compressive dielectric in the trench wherein the dielectric exerts compressive strain on a channel region laterally adjacent to the compressive dielectric.

13. The method of claim 12, wherein the hard mask layer comprises silicon nitride.

14. The method of claim 12, wherein forming the compressive dielectric comprises growing the compressive dielectric by thermal oxidation.

15. The method of claim 12, wherein forming the semiconductor structure comprises forming the semiconductor structure epitaxially wherein the semiconductor structure and the active layer share a common crystal lattice.

16. The method of claim 12, wherein the semiconductor structure comprises a material selected from the group consisting of silicon carbon and silicon germanium.

17. A semiconductor fabrication method, comprising:

forming a trench in an upper portion of a wafer, the trench having sidewalls including active layer portions exposing portions of an active layer and buried oxide portions exposing portions of a buried oxide layer underlying the active layer;

forming epitaxial structures selectively on the active layer portions of the sidewalls without forming the epitaxial structures directly on the buried oxide portions of the sidewalls; and forming a compressive dielectric by thermal oxidation in the trench wherein the thermal oxidation at least partially consumes the epitaxial structures.

18. The method of claim 17, wherein the upper portion of the wafer comprises silicon and wherein forming the epitaxial structures comprises forming structures of a material selected from silicon, silicon carbon, and silicon germanium.

* * * * *